ized Under 35

(12) United States Patent  
Yahagi et al.

(10) Patent No.: US 7,386,064 B2  
(45) Date of Patent: Jun. 10, 2008

(54) COMMUNICATION SEMICONDUCTOR INTEGRATED CIRCUIT DEVICE AND A WIRELESS COMMUNICATION SYSTEM

(75) Inventors: Koichi Yahagi, Kodaira (JP); Ryoji Furuya, Yokohama (JP); Fumiaki Matsuzaki, Kodaira (JP); Robert Astle Henshaw, Royston (GB)

(73) Assignees: Renesas Technology Corp., Tokyo (JP); TTPCOM Limited, Royston (GB); Hitachi Advanced Digital, Inc., Kanagawa (JP); Hitachi ULSI Systems Co., Ltd., Tokyo (JP)

( * ) Notice: Subject to any disclaimer, the term of this patent is extended or adjusted under 35 U.S.C. 154(b) by 317 days.

(21) Appl. No.: 10/494,245

(22) PCT Filed: Nov. 6, 2002

(86) PCT No.: PCT/GB02/04992

§ 371 (c)(1),  
(2), (4) Date: Nov. 9, 2004

(87) PCT Pub. No.: WO03/041277

PCT Pub. Date: May 15, 2003

(65) Prior Publication Data

US 2005/0068074 A1    Mar. 31, 2005

(30) Foreign Application Priority Data

Nov. 6, 2001   (GB)   ................... 0126632.9

(51) Int. Cl.  
*H03D 3/18* (2006.01)
(52) U.S. Cl. .................. 375/327; 327/536; 331/16; 331/17; 455/255; 455/258; 455/102; 455/127
(58) Field of Classification Search ............. 375/295, 375/376; 376/355; 710/52; 711/101; 327/158, 327/12, 356  
See application file for complete search history.

(56) References Cited

U.S. PATENT DOCUMENTS 5,671,201 A * 9/1997 Yokota et al. ............ 369/47.39  
6,028,905 A * 2/2000 Gaines ....................... 375/376  
6,215,362 B1 * 4/2001 Feng et al. .................. 331/17

FOREIGN PATENT DOCUMENTS

GB   2 338 127   12/1999  
JP   2001-85996   3/2001

\* cited by examiner

*Primary Examiner*—Mohammed Ghayour  
*Assistant Examiner*—Sonia J King  
(74) *Attorney, Agent, or Firm*—Mattingly, Stanger, Malur & Brundidge, PC

(57) ABSTRACT

In one embodiment, a PLL circuit is provided with a plurality of pull-in operation modes for pulling a voltage across a filter capacitor (C1, C2) in a lock-up voltage, and with a register (CRG) for designating one of the plurality of pull-in operation modes. The pull-in operation is performed in accordance with a setting value in the register.

6 Claims, 8 Drawing Sheets

COMMUNICATION SEMICONDUCTOR INTEGRATED CIRCUIT DEVICE AND A WIRELESS COMMUNICATION SYSTEM

The present invention relates to techniques effective for application to a phase locked loop (PLL) circuit with a voltage controlled oscillator (VCO). More particularly, the invention relates to techniques effective for application to a PLL circuit of a mobile communication apparatus such as a portable phone capable of transmitting/receiving signals in a plurality of frequency bands, the PLL circuit generating an oscillation signal having a predetermined frequency to be synthesized with a reception/transmission signal, and to a high frequency semi-conductor integrated circuit device and a wireless communication system using the PLL circuit.

A portable phone has a high frequency semiconductor integrated circuit device (hereinafter called a high frequency LSI) having a PLL circuit operating as a local oscillator for generating an oscillation signal of a predetermined frequency to be synthesized with a transmission signal to modulate it and with a reception signal to demodulate it.

A dual band type portable phone is known which can process signals in two frequency bands such as Global System for Mobil Communication (GSM) in the frequency band from 880 to 915 MHz and Digital Cellular System (DCS) in the frequency band from 1710 to 1785 MHz. There is a PLL circuit for such a dual band type portable phone which can process signals in the two frequency bands by changing the frequency of the PLL circuit.

During the standby state, the operation of the PLL circuit of a portable phone is stopped. The PLL circuit of a dual band type portable phone is required to change the frequency in accordance with the frequency band of a transmission/reception signal. During this frequency change, some PLL circuits are required to stop their operations. The PLL circuit once stopped is required to start again when the transmission resumes. According to a conventional general method of gradually making the control voltage Vc of VCO constituting the PLL circuit change near to a lock-up voltage, the lock-up time of the PLL circuit for transmission/reception in the higher frequency band is inherently longer than the lock-up time for transmission/reception in the lower frequency band.

To solve this problem, a lock-up method for a dual band type has been proposed. With this method, as shown in FIG. 3B, a current source for quickly charging up the capacitor of a loop filter for generating a control voltage Vc of VCO is provided to set the control voltage vc once to a power supply voltage Vcc and then gradually lower it for transmission/reception in the higher frequency band.

This method is, however, associated with a possibility of a so-called image lock. Namely, if the frequency range which VCO can oscillate is broad, PLL locks at a frequency higher than a desired frequency as indicated by a broken line in FIG. 3B. A triple band type portable phone can process signals in GSM and DCS and in addition, for example, in Personal Communication System (PCS) in the frequency band from 1850 to 1915 MHz. In this case, it is necessary to set the frequency band, which VCO of the high frequency LSI for such a triple band type portable phone can process, broader than that of the dual band type of GSM and DCS.

It can be considered that a high frequency LSI for a portable phone is required to be able to process signals in a large number of frequency bands in the future. A PLL circuit for a multi band type high frequency LSI requires a higher speed lock-up method than the above-described method. A general purpose high frequency LSI is desired which can be applied to all of dual band, triple band and single band portable phones. If there is such a general purpose high frequency LSI, portable phone manufacturers can utilize conventional hardware and software design resources. A system for a new high frequency LSI is not required to be designed again so that the development cost can be reduced.

The present inventors have studied methods of generating an intermediate frequency (hereinafter called an IF signal) prior to developments of a high frequency LSI compatible with three communication methods GSM, DCS and PCS. If the conventional method of changing the frequency of an IF signal of a high frequency LSI compatible with two communication methods GSM and DCS is incorporated, it is necessary to broaden the frequency range of the IF signal which VCO can oscillate or to selectively use two or three VCO's. This considerably increases the manufacture cost. If three IF signals are used, it is necessary to use three filters called harmonic filters for cutting harmonic components of the three IF signals. This increases the circuit area and chip size.

An object of the present invention is to provide a communication semiconductor integrated circuit device (high frequency LSI) having a PLL circuit with a plurality of pull-in modes capable of entering a lock-up state in a short time without an image lock by performing the pull-in operation in the pull-in mode suitable for the frequency band.

Another object of the present invention is to provide a communication semiconductor integrated circuit device being able to utilize conventional design resources and having a PLL circuit with a plurality of pull-in modes performing a pull-in operation by selecting the pull-in mode suitable for the system.

Preferably, another object of the present invention is to provide a method of setting the frequency of an IF signal, the method being suitable for a high frequency LSI capable of processing signals by a plurality of communication methods such as GSM, DCS and PCS.

Preferably, another object of the invention is to provide a high frequency LSI capable of processing signals by a plurality of communication methods such as GSM, DCS and PCS, in which a main portion of an oscillation circuit for generating an IF signal can be formed on a single semiconductor chip, the number of necessary filters can be reduced, and the circuit area can be reduced.

According to one aspect of the present invention, a PLL circuit is provided with a plurality of pull-in operation modes for pulling the voltage across the filter capacitor in a lock-up voltage, and with a register for designating one of the plurality of pull-in operation modes, and the pull-in operation is performed in accordance with a setting value in the register. Preferably, at least one of the plurality of pull-in operation modes is an operation mode of starting the pull-in operation at a predetermined initial voltage lower than the lock-up voltage. Preferably, at least one of the plurality of pull-in operation modes is an operation mode of raising the voltage across the filter capacitor to a predetermined voltage higher than the lock-up voltage and thereafter gradually lowering the voltage across the filter capacitor.

According to the above-described aspect, one of the plurality of pull-in operation modes can be selected by using the register. Accordingly, the PLL circuit can be locked up in a short time without an image lock. Since the pull-in operation modes same as the conventional modes are provided, conventional design resources can be utilized.

Preferably, the PLL circuit is structured so that it can select one of a plurality of levels as the initial voltage and a second register is provided for designating one of the plurality of levels. Since the initial voltage can be selected in accordance with a setting value in the second register, the lock-up can be realized at an optimum pull-in speed in accordance with the system and frequency band to be used.

According to another aspect of the present invention, in a wireless communication system capable of transmission/reception in conformity with a communication method using two or more frequency bands including at least a GSM method using a 900 MHz frequency band, the same frequency of an intermediate frequency signal to be modulated by transmission data is used for the two or more frequency bands. Since only one oscillator circuit is used for generating the intermediate frequency signal, a one chip communication semiconductor integrated circuit device having a modulation circuit can be realized. Since the oscillation frequency of the oscillation circuit is not necessary to be changed even if the frequency band to be used is changed, it is possible to generate an oscillation signal having a high precision frequency.

DESCRIPTION OF THE EMBODIMENTS

Embodiments of the invention will be described with reference to the accompanying drawings.

Figure 1:
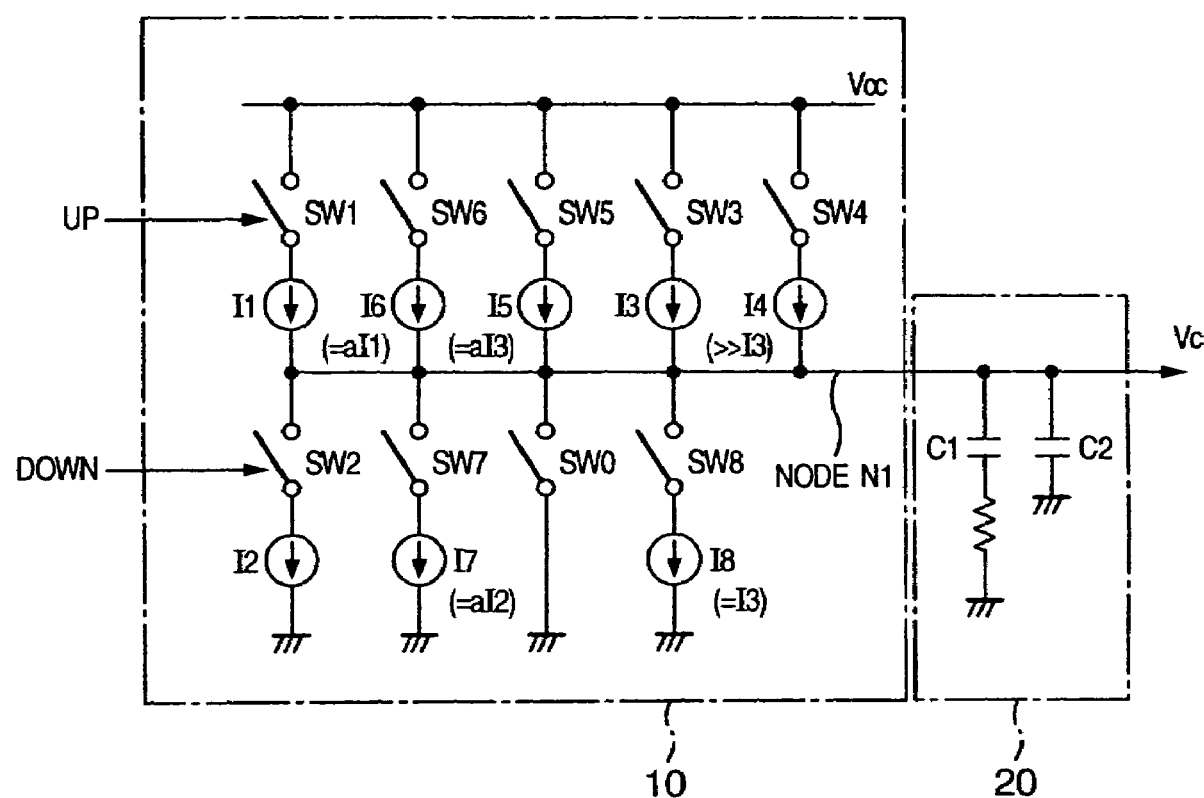
FIG. 1 is a circuit diagram of a charge pump constituting a PLL circuit according to an embodiment of the invention.

FIG. 1 shows a charge pump constituting a PLL circuit capable of performing a pull-in operation in a plurality of pull-in modes, according to an embodiment of the invention. In FIG. 1, reference numeral 10 represents a charge pump, and reference numeral 20 represents a loop filter. A charge voltage Vc of the loop filer 20 is output as a control voltage for a VCO (not shown).

As shown in FIG. 1, the charge pump 10 of this embodiment has: a switch SW1 which is turned on and off by an up signal UP supplied from a phase detecting circuit (not shown); a switch SW2 which is turned on and off by a down signal DOWN supplied from the phase detecting circuit; constant current sources I1 and I2 serially connected to the switches SW1 and SW2; and a switch SW0 connected between a charge/discharge node N1 and ground point. The switches SW1 and SW2 are turned on and off by the up signal Up and down signal DOWN supplied from the phase detecting circuit so that capacitors C1 and C2 of the loop filter 20 are charged up and down to make constant the control voltage Vc under the condition that the PLL circuit is locked. A switch SW0 resets the voltage Vc of the loop filter 20 to a zero voltage when the operation of the PLL circuit stops.

In order to speed up the PLL circuit pull-in operation, the charge pump 10 of this embodiment has also: a switch SW3 and a constant current source I3; a switch SW4 and a constant current source I4; a switch SW5 and a constant current source I5; a switch SW6 and a constant current source I6, respectively connected between the power source voltage Vcc and charge/discharge node N1; a switch SW7 and a constant current source I7; and a switch SW8 and a constant current source I8, respectively connected between the charge/discharge node N1 and ground point.

Of the constant current sources I3 to I8, the constant current source I3 is a current source for flowing a reference current and is used for a pull-in operation at a relatively low frequency. The constant current source I4 is used for charging up the charge/discharge node N1 to the power source voltage Vcc. The current I4 is much larger than the current I3, i.e., I4>>I3. The constant current source I5 flows a current of a×I3 (I5<I4) where a>1, the constant current source I6 flows a current of a×I1, and the constant current source I7 flows a current of a×I2. The constant current source I8 is a current source used for charging down after the charge/discharge node N1 is once charged up to the power source voltage Vcc by the constant current source I4 to change the frequency near to a target frequency, and flows a current, for example, approximately equal to the constant current source I3.

In the PLL circuit of this embodiment, the following four pull-in modes are possible under the control of the switches SW3 to SW8 during the operation of the PLL circuit.

Figure 2A:
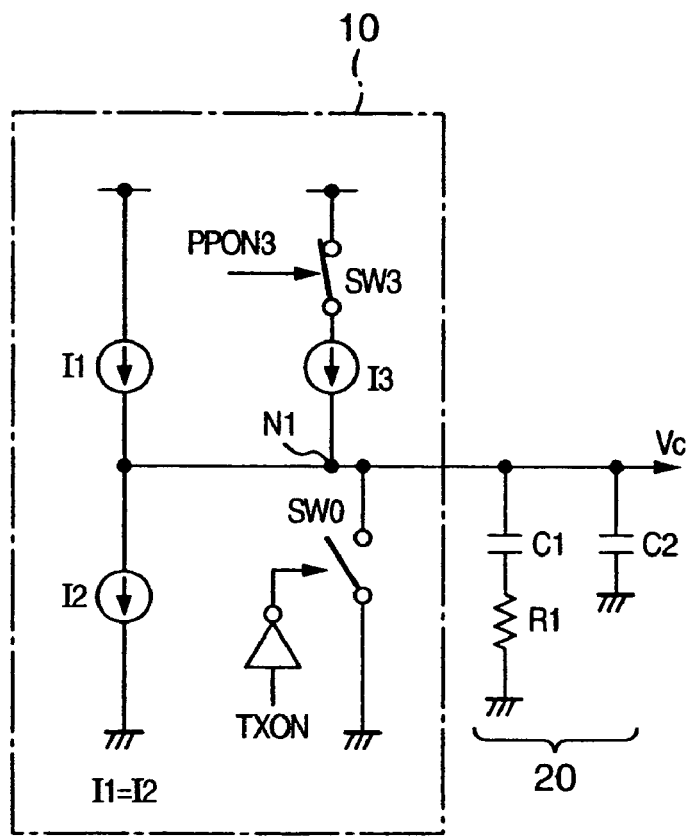
FIGS. 2A and 2B are an equivalent circuit of the charge pump in a first pull-in mode (normal pull-in mode) of the PLL circuit shown in FIG. 1, and a timing chart illustrating the first pull-in mode.
Figure 2B:
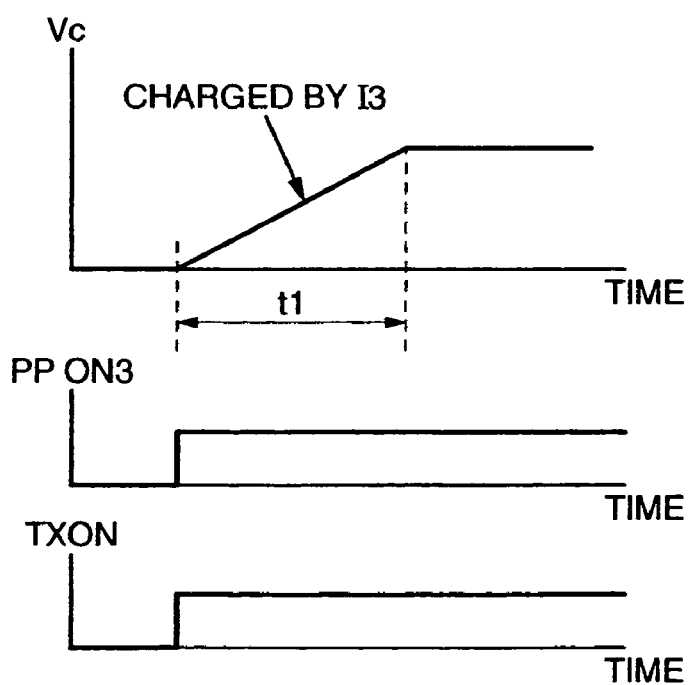

A first pull-in mode is a normal pull-in mode using only the constant current source I3. FIG. 2A shows the equivalent circuit in this mode, and FIG. 2B is a timing chart illustrating this mode. In this mode, when a start-up signal TXON rises, the switch SW0 is turned off and the switch SW3 is turned on by a control signal PPON3. Therefore, the voltage Vc at the node N1 rises along a slope determined by the time constant of the loop filter 20 and the current value of the constant current source I3. After the voltage Vc reaches a voltage sufficient for the PLL control, the loop is controlled by I1 and I2 and the voltage Vc is fixed to the lock-in voltage. A time period t1 from the PLL start-up to when the voltage Vc is fixed, is a lock-up time.

Figure 3A:
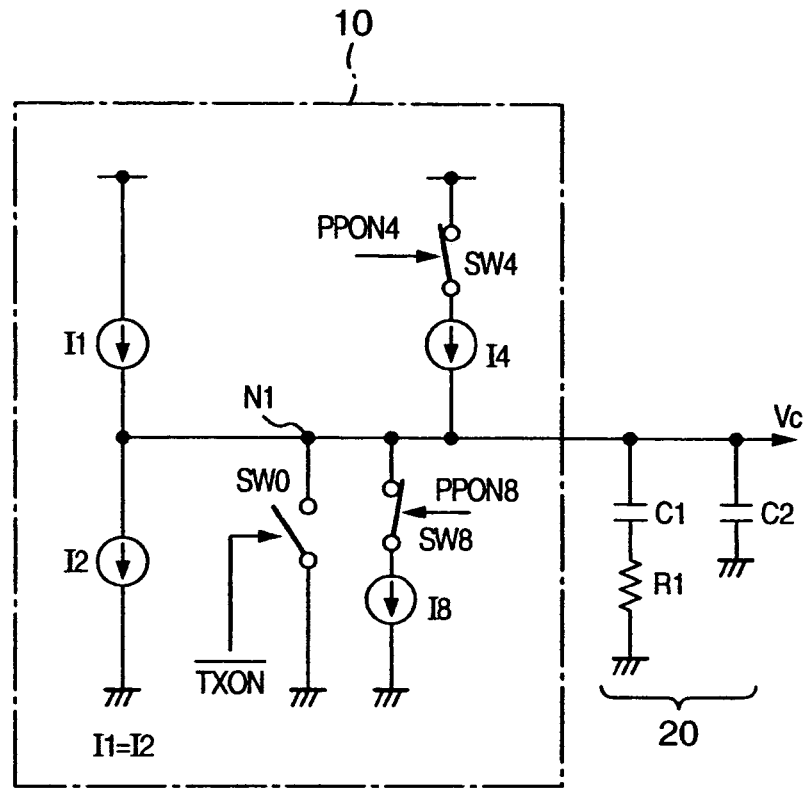
FIGS. 3A and 3B are an equivalent circuit of the charge pump in a second pull-in mode (down-sweep pull-in mode) of the PLL circuit shown in FIG. 1, and a timing chart illustrating the second pull-in mode.
Figure 3B:
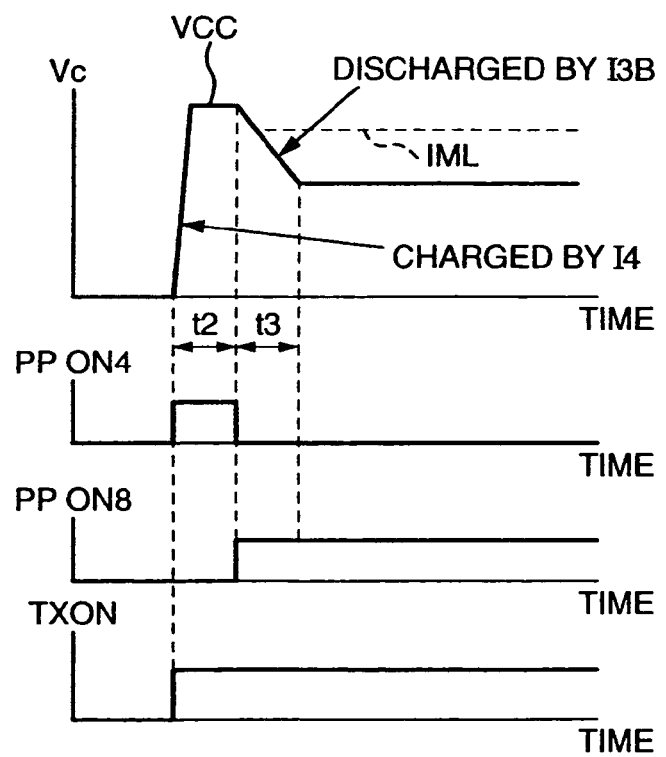

A second pull-in mode is a down-sweep pull-in mode using the constant current sources I4 and I8. FIG. 3A shows the equivalent circuit in this mode, and FIG. 3B is a timing chart illustrating this mode. In this mode, first the switch SW4 is turned on for a time period t2 by a control signal PPON4. After the loop filter 20 is charged up once to the power source voltage Vcc by the constant current source I4, the switch SW4 is turned off. Then, the switch SW8 is turned on by a control signal PPON8 and the node N1 is charged down by the constant current I8 to the lock-up voltage.

Figure 4A:
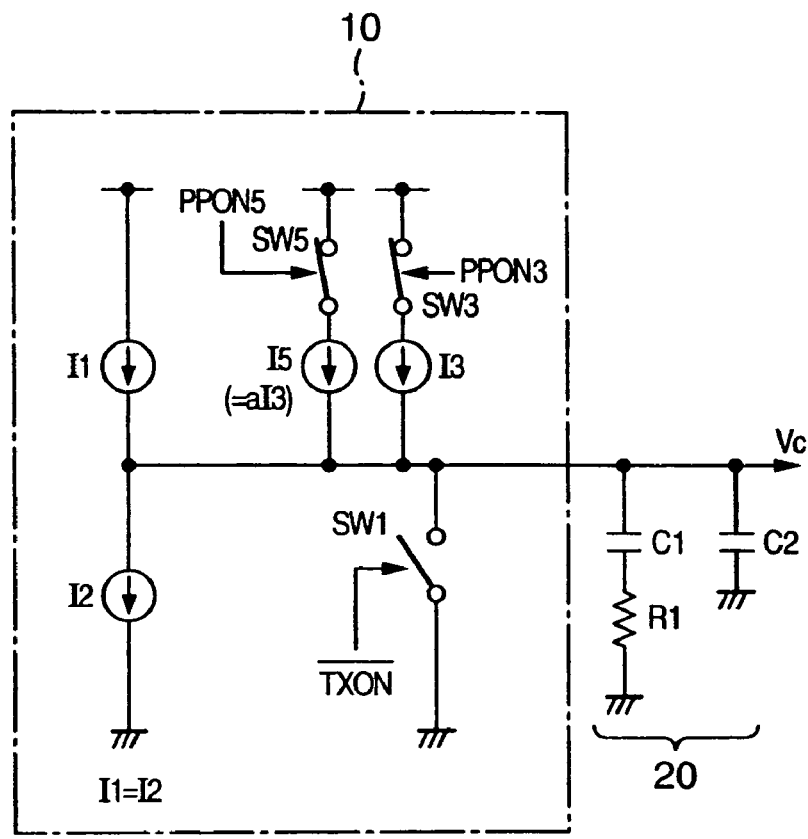
FIGS. 4A and 4B are an equivalent circuit of the charge pump in a third pull-in mode (up-sweep pull-in mode) of the PLL circuit shown in FIG. 1, and a timing chart illustrating the third pull-in mode.
Figure 4B:
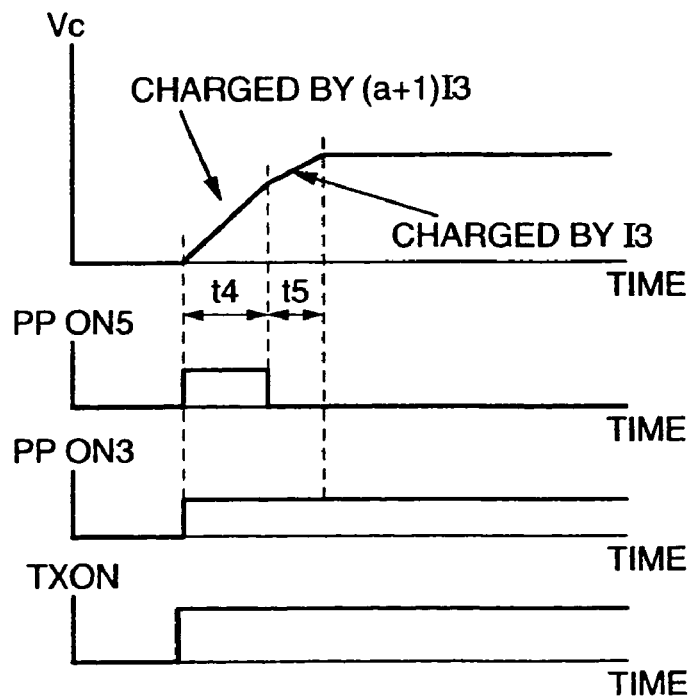

A third pull-in mode is an up-sweep pull-in mode using the constant current sources I3 and I5. FIG. 4A shows the equivalent circuit in this mode, and FIG. 4B is a timing chart illustrating this mode. In this mode, first the switches SW3 and SW5 are turned on for a time period t4 by control signals PPON3 and PPON5. After the loop filter 20 is charged up to a voltage slightly lower than the target voltage by the constant current source I5, the switch SW5 is turned off and the switch SW3 is maintained on by the control signal PPON3. Therefore, the loop filter 20 is gradually charged up by the constant current source I3 to reach a lock-up voltage. In this mode, therefore, the pull-in operation can be performed at a higher speed than the first mode (normal mode), and an image lock which is likely to occur in the second mode can be avoided. The PLL loop operation state (closed loop bandwidth) in the lock-in state is the same as the normal mode.

Figure 5A:
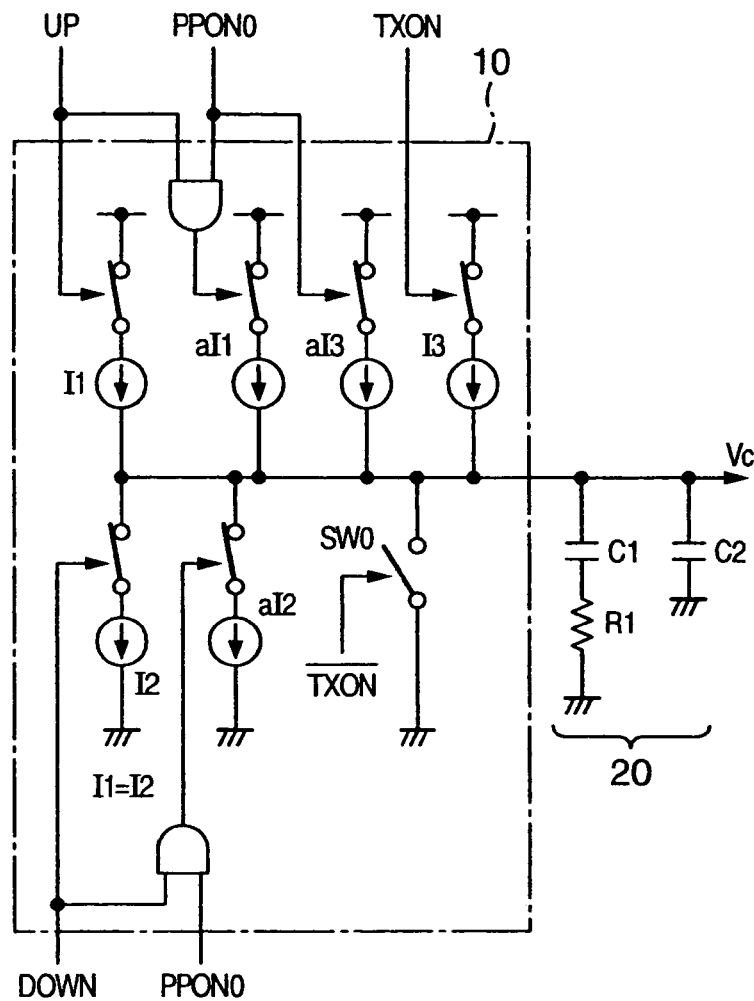
FIGS. 5A and 5B are an equivalent circuit of the charge pump in a fourth pull-in mode (up-sweep ultra high speed pull-in mode) of the PLL circuit shown in FIG. 1, and a timing chart illustrating the fourth pull-in mode.
Figure 5B:
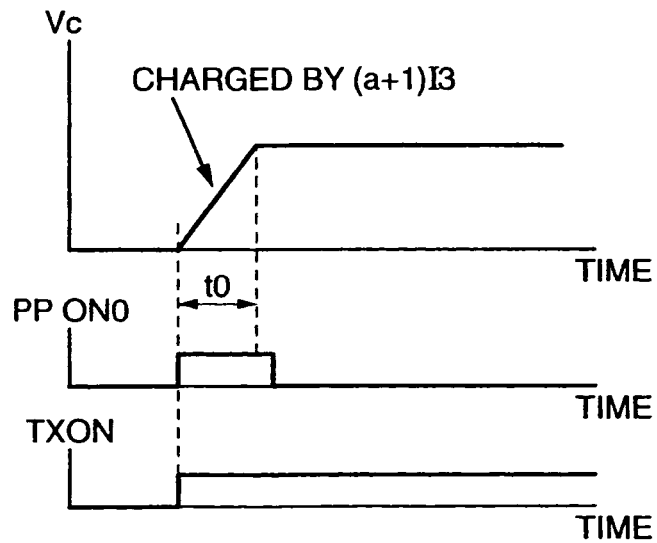

A fourth pull-in mode is an up-sweep ultra high speed pull-in mode using the constant current sources I5, I6 and I7. FIG. 5A shows the equivalent circuit in this mode, and FIG. 5B is a timing chart illustrating this mode. In this mode, first the switch SW5 is turned on by a control signal PPON0 so that the loop filter 20 is charged up to the power source voltage Vcc by the constant current sources I3 and I5. At this time, the constant current sources I6 and I7 are controlled by the up signal UP and down signal DOWN same as the constant current sources I1 and I2 and the control signal PPON0.

Therefore, the loop filter 20 is charged up substantially by the currents of the constant current sources I3 and I5, i.e., (a+1)×I3. Even if the sweep-up is performed by the current (a+1)×I3 larger than I3 in the normal mode, the current of the constant current sources I1 and I2 controlled by the signals supplied from the phase detecting circuit at the preceding stage is multiplied by (a+1), so that the control of the PLL loop operates normally and the lock-in is possible.

The closed loop bandwidth in the lock-in state is proportional to the current of the constant current sources I1 and I2 controlled by signals supplied from the phase detecting circuit. Therefore, if the current of the constant current sources I1 and I2 is maintained large, noises cannot be eliminated sufficiently. However, in the fourth mode of the PLL circuit of this embodiment, immediately after the lock-in, the switches SW6 and SW7 together with the switch SW5 are turned off by the control signal PPON0. Therefore, the closed loop bandwidth in the lock-in state can be made same as that of the other modes.

Figure 6A:
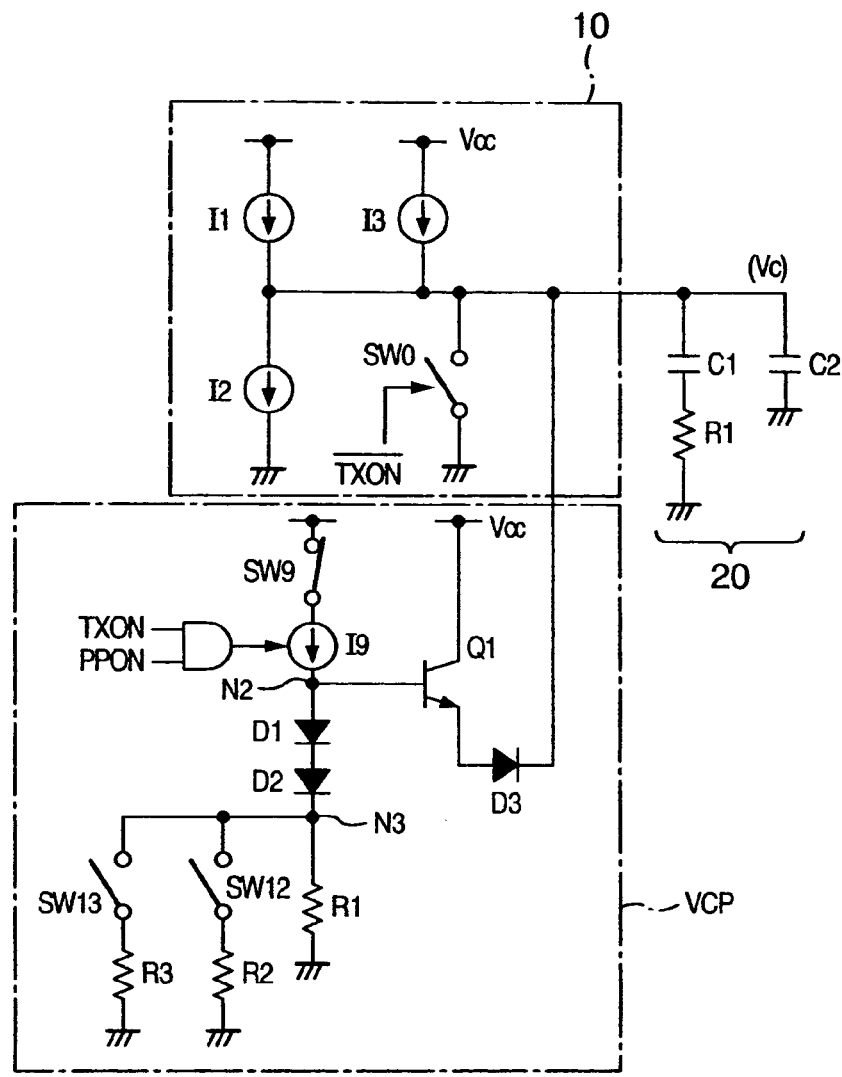
FIGS. 6A and 6B are a circuit diagram of a charge pump constituting a PLL circuit and a timing chart illustrating the operation, according to another embodiment of the invention.
Figure 6B:
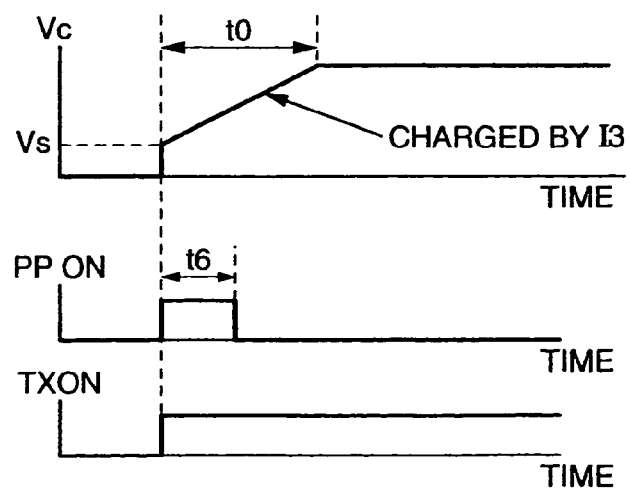

FIGS. 6A and 6B are a circuit diagram of a PLL circuit and a timing chart illustrating the operation, according to another embodiment of the invention. In this embodiment, in place of the constant current sources I4 to I8 of the charge pump of the above-described embodiment, there is provided a pre-charge circuit VCP for raising the level of the charge/discharge node N1 at the start-up time. For example, as shown in FIG. 6A, the pre-charge circuit VCP is constituted of: a switch SW9, a constant current source I9, diodes D1 and D2 and a resistor R1, respectively connected serially between the power supply voltage Vcc and ground point; and a transistor Q1 and a diode D3 respectively connected serially between the power supply voltage Vcc and charge/discharge node N1 of the charge pump. A potential at a connection node N2 between the constant current source I9 and diode D1 is applied to the base of the transistor Q1.

In this embodiment, resistors R2, R3, . . . are also provided in parallel to the resistor R1. Switches SW12, SW13, . . . are connected to the resistors R2, R3, . . . . In FIG. 6A, only the resistors R2 and R3 and switches SW12 and SW13 are shown and other resistors and switches are omitted. In the pre-charge circuit VCP of this embodiment, when the switch SW9 is turned on by a start-up signal TXON and current flows from the constant current source I9, the transistor Q1 turns on so that the potential at the charge/discharge node N1 of the charge pump 10 rises quickly.

The base-emitter voltage of the transistor Q1 can be considered equal to the forward voltage of the diode. When the transistor Q1 is turned on, the potential at the charge/discharge node N1 of the charge pump 10 is lower than the base potential of the transistor Q1 by a twofold of the diode forward voltage. The base potential of the transistor Q1 is higher than the potential at a connection node N3 between the resistor R1 and diode D2 by a twofold of the diode forward voltage. Therefore, as shown in FIG. 6B, the potential at the charge/discharge node N1 of the charge pump 10 is raised quickly after the start-up to the potential at the connection node N3 between the resistor R1 and diode D2 of the pre-charge circuit VCP, and thereafter, the potential is raised by the current from the constant current source I3. As a result, the potential reaches the lock-up voltage faster than the case that the pre-charge circuit VCP is charged up only by the current from the constant current source I3. The potential at the connection node N3 is determined by the value of the resistor R1 and the current flowing therethrough.

In this embodiment, the resistors R2, R3, are provided in parallel to the resistor R1, and the resistor through which current flows can be selected by the switches SW12, SW13, . . . . Therefore, by controlling the switches SW12, SW13, . . . , the potential at the node N2, i.e., an initial voltage at the start-up of the charge pump 10 can be set as desired. When the transistor Q1 turns on, the collector current of the transistor Q1 charges the capacitors of the loop filter 20, and when the potential at the charge/discharge node N1 of the charge pump 10 rises to the potential at the node N3 of the pre-charge circuit VCP, the transistor Q1 is automatically turned off. It is therefore sufficient even if the time period t6 of the high level of the control signal PPON for the transistor Q1 is relatively short.

In the pull-in mode shown in FIGS. 4A and 4B, it can be considered that the initial charge-up by the current of the constant current source I3 and the current of a×I3 gives the initial voltage for the charge-up to be performed continuously by the constant current source I3. Namely, the pre-charge circuit VCP shown in FIG. 6A can be considered as a modification of the embodiment shown in FIGS. 4A and 4B. As a method of setting a plurality of initial voltages to the charge pump at the PLL start-up time, the resistors R1, R2, R3, . . . may be replaced by diode trains each having the different number of diodes.

Figure 7:
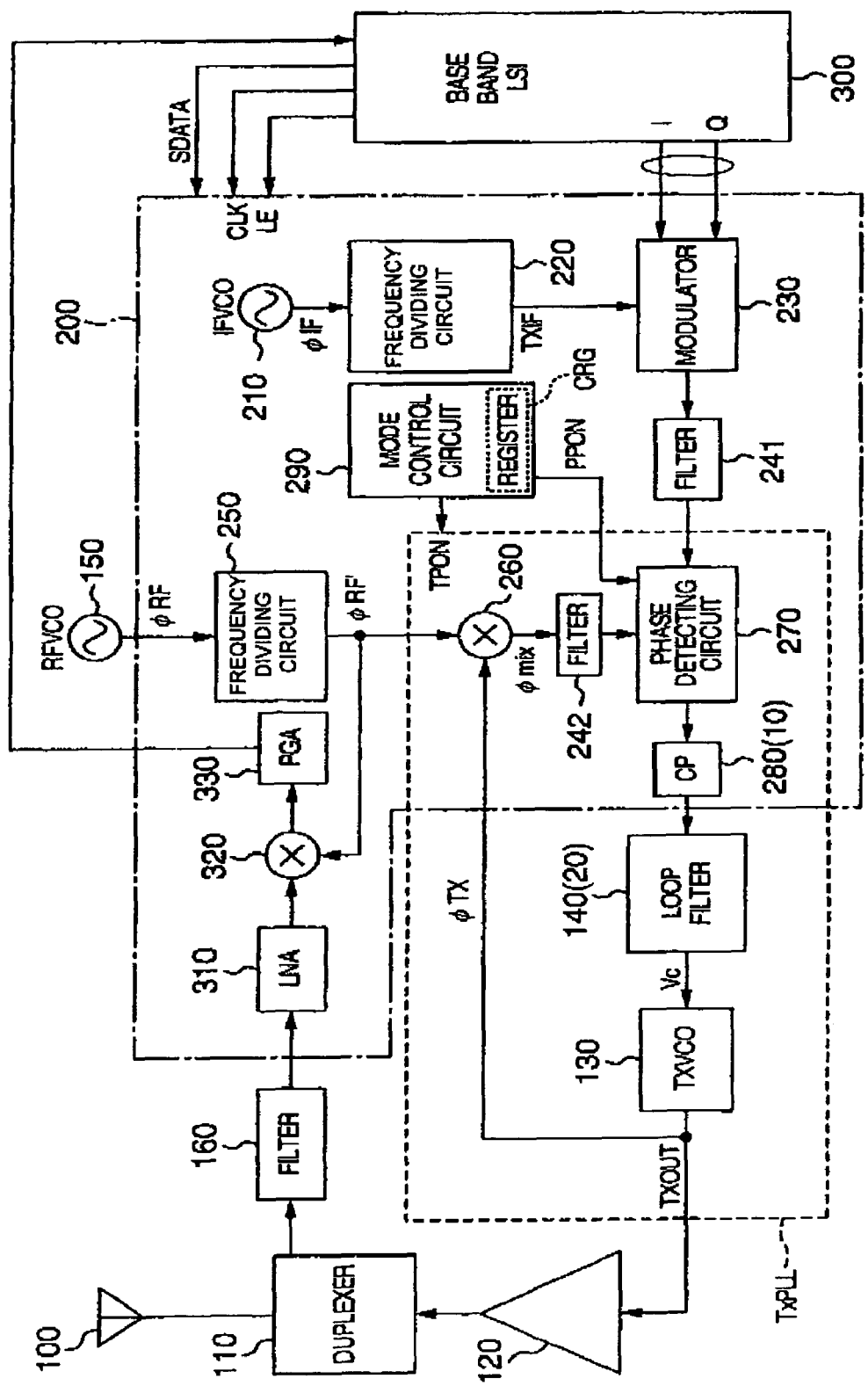
FIG. 7 is a block diagram showing an example of the structure of a portable phone as one example of a wireless communication system, according to another embodiment of the invention.

Next, the description is directed to the case that a PLL circuit is applied to a high frequency LSI of a mobile communication system of a multi band type. FIG. 7 shows an example of the detailed structure of a high frequency LSI and the outline structure of a mobile communication system, according to another embodiment of the invention.

In FIG. 7, an antenna 100 transmits/receives a radio wave. Reference numeral 200 represents a high frequency LSI, and reference numeral 110 represents a transmission/reception switch (duplexer). A high frequency power amplifier circuit 120 amplifies a transmission signal. Reference numeral 130 represents a transmission oscillator TXVCO, and reference numeral 140 represents a loop filter constituting a transmission side PLL circuit. A high frequency oscillator RFVCO 150 generates an oscillation signal having a frequency corresponding to a desired frequency band. A high frequency filter 160 removes unnecessary radio waves from a reception signal. A baseband circuit (LSI) 300 converts a transmission signal into I and Q signals and controls the high frequency LSI 200. Although not specifically limited, in this embodiment, the high frequency oscillator RFVCO 150 is used in common for the transmission side circuit and reception side circuit.

The transmission side circuit of the high frequency LSI 200 includes: an oscillator circuit IFVCO 210; a frequency dividing circuit 220; a modulator circuit 230; a frequency dividing circuit 250; a mixer 260; a harmonic filter 242; a phase detecting circuit 270; a charge pump 280; a mode control circuit 290; and the like. The oscillator circuit IFVCO 210 generates an oscillation signal (IF having an intermediate frequency FRF, e.g., 320 MHz. The frequency dividing circuit 220 frequency-divides the oscillation signal φIF generated by the oscillation circuit 210 and generates a carrier having a frequency of, e.g., 80 MHz. The modulator circuit 230 quadrature-modulates the carrier output from the frequency dividing circuit 220 by using the I and Q signals supplied from the baseband circuit 300. The frequency dividing circuit 250 frequency-divides a signal φRF' supplied from the high frequency oscillator 150. The mixer 260 synthesizes the signal φRF' frequency-divided by the frequency dividing circuit 250 and a transmission signal φTX fed back from the transmission oscillator TXVCO 130 to generate a signal φmix having a frequency corresponding to the frequency difference between the two signals. The harmonic filter 242 cuts the harmonic components of a signal leaked from the mixer 260. The phase detecting circuit 270 detects a phase difference between the signal supplied from the mixer 260 and the modulation signal supplied from the modulator circuit 230. The charge pump 280 is controlled by signals UP and DOWN output from the phase detecting circuit 270.

The reception side circuit includes; a low noise amplifier 310 for amplifying a reception signal; a demodulator circuit 320 for performing a demodulation operation by synthesizing the reception signal and the oscillation signal φRF of the high frequency oscillator 150 frequency-divided by the frequency dividing circuit 250; a programmable gain amplifier 330 for amplifying a demodulated signal and outputting it to the baseband circuit 300.

In this embodiment, the circuit having the structure shown in FIG. 1 is used for the charge pump 280 and loop filter 140. The transmission side PLL circuit TXPLL generally called an offset PLL for frequency conversion is constituted of the charge pump 280, phase detecting circuit 270, loop filter 140, transmission oscillator TXVCO 130 and mixer 260. In the mobile communication system of a multi band type, the transmission frequency is changed with the frequency band to be used, by changing the oscillation frequency FRF of the high frequency oscillator 150, for example, in response to a command from the baseband circuit 300.

The mode control circuit 290 has a control register CRG. Values are set in this control register CRG in accordance with a signal from the baseband circuit 300. More specifically, the baseband circuit 300 supplies the high frequency LSI 200 with a clock signal CLK for synchronization, a data signal SDATA, and a load enable signal LEN as a control signal. When the load enable signal LEN of an effective level is asserted, the mode control circuit 290 sequentially captures the data signal SDATA sent from the baseband circuit 300 synchronously with the clock signal CLK and sets it to the control register CRG. Although not specifically limited, the data signal SDATA is sent serially. The baseband circuit 300 is made of a microprocessor and the like.

Although not specifically limited, in this embodiment, the control register CRG has two bits of PLL pull-in mode selection bits PP0 and PP1 and three bits of pulse width designation bits TP0 to TP2 for designating the pulse width of each signal PPON, i.e., the on-time of each switch which controls on-off of each of the switches SW3 to SW8 of the charge pump 10 shown in FIG. 1. Table 1 shows the relation between the pull-in mode and the PLL pull-in selection bits PP0 and PP1 of the control register CRG, and Table 2 shows the relation between the on-off control signal for the switches SW3 to SW8 and the pulse width designation bits TP0 to TP2. In accordance with the states of these bits, the mode control circuit 290 controls the operation mode and pulse width of the charge pump.

Figure 8:
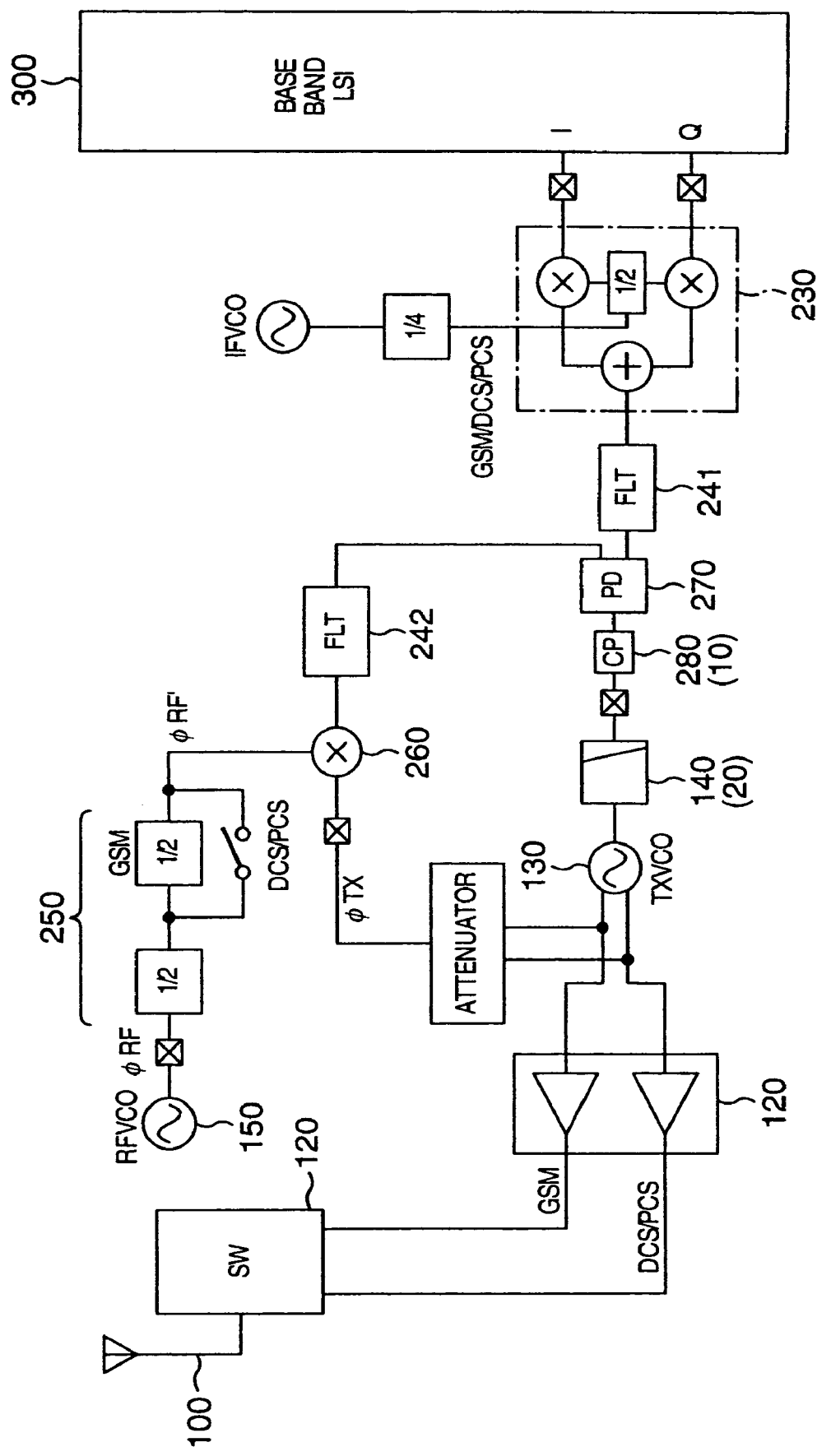
FIG. 8 is a block diagram showing an example of the structure of a transmitter unit of a portable phone as one example of a wireless communication system, according to another embodiment of the invention.

The mode 2 may be selected by changing the resistor as shown in FIG. 8, instead of changing the current sources to I3 and a×I3. In this case, the resistors R2, R3, . . . are selected by the pulse width designation bits TP0 to TP2 to change the initial voltage at the PLL start-up. In this embodiment, although one of the four pull-in modes shown in Table 1 is selected, five or more pull-in modes may be used, for example, adding a pull-in mode by changing the resistor such as shown in FIG. 8 and other pull-in modes.

TABLE 1

| PP BITS | | MODE | CONTROL STATE | CURRENT SOURCES | FIGURE |
|---|---|---|---|---|---|
| 0 | 0 | MODE 0 | NORMAL LOCK | I3 | FIG. 2 |
| 0 | 1 | MODE 1 | DOWN-SWEEP | I4, I8 | FIG. 3 |
| 1 | 0 | MODE 2 | UP-SWEEP HIGH SPEED 1 | I3, I5(aI3) | FIG. 4 |
| 1 | 1 | MODE 3 | UP-SWEEP HIGH SPEED 2 | I3, I5, I6, I7 | FIG. 5 |

TABLE 2

| TP BITS | PULSE WIDTH |
|---|---|
| 000 | 0 μsec |
| 001 | 5 μsec |
| 010 | 10 μsec |
| 011 | 15 μsec |
| 100 | 20 μsec |
| 101 | 25 μsec |
| 110 | 30 μsec |
| 111 | 35 μsec |

In the high frequency LSI of this embodiment, the transmission side PLL has a plurality of pull-in modes. It is therefore possible to change the pull-in mode in accordance with the frequency band used by a multi band wireless communication system or in accordance with the applied system. The lock-in state can therefore be obtained in a short time after the PLL start-up. If the down-sweep high speed lock-up of the mode 1 is not used, the high speed lock-up becomes possible while the image lock at an undesired frequency is reliably avoided. There may be a system which uses a high frequency LSI having a down-sweep high speed lock-up mode and can avoid the image lock by devising a system control program or the like. If the high frequency LSI of the embodiment is used as the high frequency LSI of such a system and the down-sweep high speed lock-up mode of the mode 1 is selected, it is possible to configure the system capable of avoiding the image lock by utilizing conventional resources.

Next, a method of setting a frequency of an oscillator, particularly an oscillator for generating an oscillation signal of an intermediate frequency, will be described with reference to Table 3 to Table 5 and FIG. 8. In the following description, the embodiment is applied to a high frequency LSI of a triple band type mobile communication system capable of processing three signals in the GSM frequency band from 880 to 915 MHz, DCS frequency band from 1710 to 1785 MHz, and PCS frequency band from 1850 to 1910 MHz.

TABLE 3

|  | IFVCO (MHz) | TXIF (MHz) | TXVCO (MHz) | RXVCO (MHz) | |
|---|---|---|---|---|---|
|  |  |  |  | RECEPTION | TRANS-MISSION |
| GSM900 | 360 | 45 | 880 | 3700 | 3700 |
|  | 360 | 45 | 915 | 3840 | 3840 |
| DCS1800 | 380 | 95 | 1710 | 3610 | 3610 |
|  | 380 | 95 | 1785 | 3760 | 3760 |

Table 3 shows an example of setting the frequencies of oscillation signals φIF, φTX and φRF of the intermediate frequency oscillator IFVCO 210, transmission oscillator TXVCO 130 and high frequency oscillator RFVCO 150 of a high frequency LSI of a dual band type capable of processing signals in conventional two GSM and DCS frequency bands. As shown in Table 3, according to the conventional techniques, the oscillation frequency of the intermediate oscillator IFVCO 210 is set to 360 MHz for GSM and to 380 MHz for DCS. These frequencies are then frequency-divided at the frequency dividing circuit 220 by ⅛ into 45 MHz of the carrier TXIF for GSM, and by ¼ into 95 MHz of the carrier TXIF for DCS, the carrier being modulated thereafter.

The oscillation frequency of the high frequency oscillator RFVCO 150 is set to 3700 to 3840 MHz for GAM and to 3610 to 3760 MHz for DCS. These frequencies are then frequency-divided at the frequency dividing circuit 250 by ¼ for GSM and by ½ for DCS to obtain φRF' which is supplied to the mixer 260. The mixer 260 outputs a difference signal corresponding to a difference (FRF−FTX) between φRF' and the transmission oscillation signal φTX supplied from the transmission oscillator 130. PLL operates to make the difference signal frequency be equal to the modulated signal frequency FTXIF.

Table 4 shows an example of setting the frequencies of oscillation signals of oscillators of a high frequency LSI of a triple band type capable of processing signals in GSM and DCS and PCS. This setting is performed in a similar manner to a conventional example of setting the oscillation frequencies φIF, φTX and φRF of the intermediate frequency oscillator IFVCO 210, transmission oscillator TXVCO 130 and high frequency oscillator RFVCO 150 of a high frequency LSI of a dual band type capable of processing signals in conventional two GSM and DCS frequency bands.

TABLE 4

|  | IFVCO (MHz) | TXIF (MHz) | TXVCO (MHz) | RXVCO (MHz) | |
|---|---|---|---|---|---|
|  |  |  |  | RECEPTION | TRANS-MISSION |
| GSM900 | 360 | 45 | 880 | 3700 | 3700 |
|  | 360 | 45 | 915 | 3840 | 3840 |

TABLE 4-continued

|  | IFVCO (MHz) | TXIF (MHz) | TXVCO (MHz) | RXVCO (MHz) | |
|---|---|---|---|---|---|
|  |  |  |  | RECEPTION | TRANS-MISSION |
| DCS1800 | 380 | 95 | 1710 | 3610 | 3610 |
|  | 380 | 95 | 1785 | 3760 | 3760 |
| PCS1900 | 320 | 80 | 1850 | 3860 | 3860 |
|  | 320 | 80 | 1910 | 3980 | 3980 |

As seen from Table 4, if the frequency of each oscillator is set in a similar manner to the conventional example, for PCS, the oscillation frequency of the intermediate frequency oscillator IFVCO 210 is set to 320 MHz which is frequency-divided at the frequency dividing circuit 220 by ¼ to generate the carrier TXIF of 80 MHz to be modulated. For PCS, the oscillation frequency of the high frequency oscillator RFVCO 150 is set to 3860 to 3980 MHz which is frequency-divided at the frequency dividing circuit 250 by ½ to be supplied to the mixer 260. It is therefore necessary for the oscillation frequency of the intermediate frequency oscillator IFVCO 210 to be set in the range from 320 to 380 MHz corresponding to the frequency band to be used. Namely, there is a change width of about 15 to 18%.

It is difficult to form an oscillator capable of oscillating at a correct oscillation frequency in such a large change width. From this reason, three oscillators for three frequency bands are selectively used. If three frequencies of the intermediate frequency signals are used, in order to cut these harmonic components, three harmonic filters 241 and three harmonic filters 242 are required to be placed between the modulator circuit 230 and phase detecting circuit 270 and between the mixer 260 and phase detecting circuit 270 shown in FIG. 7. This increases the circuit area and chip size. From this reason, it is difficult to form one chip high frequency LSI of a triple band type.

Table 5 shows an example of setting the frequencies of oscillation signals φIF, φTX and φRF of the intermediate frequency oscillator IFVCO 210, transmission oscillator TXVCO 130 and high frequency oscillator RFVCO 150 of a high frequency LSI of a triple band type according to the embodiment.

TABLE 5

|  | IFVCO (MHz) | TXIF (MHz) | TXVCO (MHz) | RXVCO (MHz) | |
|---|---|---|---|---|---|
|  |  |  |  | RECEPTION | TRANS-MISSION |
| GSM900 | 640 | 80 | 880 | 3700 | 3840 |
|  | 640 | 80 | 915 | 3840 | 3980 |
| DCS1800 | 640 | 80 | 1710 | 3610 | 3580 |
|  | 640 | 80 | 1785 | 3760 | 3730 |
| PCS1900 | 640 | 80 | 1850 | 3860 | 3860 |
|  | 640 | 80 | 1910 | 3980 | 3980 |

As shown in Table 5, in this embodiment, the oscillation frequency of the intermediate frequency oscillator IFVCO 210 is set to 640 MHz for all GSM, DCS and PCs which is then frequency-divided at the frequency dividing circuit 220 by ⅛ to generate the carrier TXIF of 80 MHz to be modulated.

The oscillation frequency of the high frequency oscillator RFVCO 150 is set to 3840 to 3980 MHz for GSM, to 3580 to 3730 MHz for DCS, and to 3860 to 3980 MHz for PCS. These frequencies are frequency-divided at the frequency dividing circuit 250 by ¼ for GSM and by ½ for DCS and PCS to generate φRF' and supply it to the mixer 260. The mixer 260 outputs a difference signal corresponding to a difference (FRF–FTX) between φRF' and the transmission oscillation signal φTX supplied from the transmission oscillator 130. The transmission PLL (TXPLL) operates to make the difference signal frequency be equal to the modulated signal frequency FTXIF.

As understood from the comparison between Tables 4 and 5, the oscillation frequency of the intermediate frequency oscillator IFVCO 210 is set to 640 MHz for all GSM, DCS and PCS. Therefore, although three oscillators are necessary if the conventional design techniques are used, only one oscillator is used in this embodiment. Since only one intermediate frequency oscillator IFVCO 210 is used, only one harmonic filter 241 and only one harmonic filer 242 are provided between the modulator circuit 230 and phase detecting circuit 270 and between the mixer 260 and phase detecting circuit 270 as shown in FIG. 8.

It is therefore possible to considerably reduce the circuit area as compared to the conventional techniques. It is also possible to form the intermediate frequency oscillator IFVCO 210 excepting the capacitor element (if a Colpitts oscillator circuit using an LC resonance circuit is used, an inductor element and a varicap diode are included) on a semiconductor chip and to form one chip high frequency LSI. The number of components of a mobile communication apparatus such as a portable phone can therefore be reduced and the apparatus can be made compact.

As understood from the comparison between Tables 4 and 5, in this embodiment, the oscillation frequency range of the high frequency oscillator RFVCO 150 increases to 3580 to 3980 MHz from the conventional maximum change range from 3610 to 3840 MHz. It is necessary to increase the oscillation frequency range of the high frequency oscillator RFVCO 150 more than the conventional range. However, this change width is only about 10% and the design is easier than the conventional case that the oscillation frequency change width of the intermediate frequency oscillator IFVCO 210 is broadened (as described earlier, about 15 to 18%).

In this embodiment, although the oscillation frequency of the intermediate frequency oscillator IFVCO 210 is set to 640 MHz and the frequency of the carrier TXIF is set to 80 MHz, these frequencies are not limited only thereto, but the integer multiplication of these frequencies may also be used. For example, even if the frequency of the carrier TXIF is doubled to 160 MHz, the circuit operates normally. However, the consumption power at the 80 MHz is smaller than that at 110 MHz. This embodiment is applied to a high frequency LSI of the triple band type capable of processing three signals in GSM, DCS and PCS frequency bands so that frequency of the carrier TXIF is set to 80 MHz. It is obvious that for a high frequency LSI processing a signal of another frequency band, a frequency suitable for this LSI is set.

The invention made by the present inventors has been described specifically in connection with the embodiments. The invention is not limited only to those embodiments. For example, although the embodiments are applied to a high frequency LSI of the triple band type capable of processing three signals in GSM, DCS and PCS frequency bands, the embodiments may be applied to a high frequency LSI of a dual band type capable of processing two signals among two of GSM, DCS and PCS.

In the foregoing description, the invention made by the present inventors is applied to a PLL circuit used by a wireless communication system such as a portable phone in the application field of the background of the invention. The invention is not limited only thereto, but the invention is broadly applicable to a semiconductor integrated circuit device with a PLL circuit, particularly to a general semiconductor integrated circuit device with a PLL circuit whose operation is temporarily stopped.

According to the embodiments of the invention, the pull-in operation is performed in the pull-in mode suitable for the frequency band so that the lock-up can be realized in a short time without an image lock. Since the semiconductor integrated circuit device has a PLL circuit capable of performing a pull-in operation by selecting the pull-in mode suitable for the system, conventional design resources can be used as they are.

A method of setting the frequency of an intermediate frequency signal is provided, which frequency is optimum to the high frequency LSI capable of communications by a plurality of communication methods such as GSM, DCS and PCS. Accordingly, the main circuit portion of the oscillator circuit for generating an intermediate frequency signal can be formed on one semiconductor chip. The number of necessary filters is small so that the circuit area can be reduced.

What is claimed is:

1. A communication semiconductor integrated circuit device with a PLL circuit having a phase detecting circuit for detecting a phase difference between a signal having a predetermined frequency and a feedback signal, a charge pump and a filter capacitor for generating a voltage corresponding to the phase difference detected by the phase detecting circuit, and an oscillator circuit for performing an oscillation operation in accordance with the voltage across the filter capacitor, comprising first and second registers which output control values set therein, wherein
the charge pump includes a plurality of first current sources which are controlled in accordance with outputs of the phase detecting circuit, and a plurality of second current sources which are controlled in accordance with outputs of the first and second registers,
in the first register, the control value for selecting one of the second current sources to be turned on is set,
in the second register, the control value for selecting an initial voltage at start-up of the PLL circuit is set,
the PLL circuit has a plurality of pull-in operation modes which are controlled in accordance with the outputs of the first and second registers, for pulling the voltage across the filter capacitor in a lock-up voltage in response to an activation of the PLL circuit, and performs the pull-in operation in accordance with a setting value in the first register for designating one of the plurality of pull-in operation modes.

2. A communication semiconductor integrated circuit device according to claim 1, wherein at least one of the plurality of pull-in operation modes is an operation mode of starting the pull-in operation at a predetermined initial voltage lower than the lock-up voltage.

3. A communication semiconductor integrated circuit device according to claim 2, wherein at least one of the plurality of pull-in operation modes is an operation mode of raising the voltage across the filter capacitor to a predetermined voltage higher than the lock-up voltage and thereafter gradually lowering the voltage across the filter capacitor.

4. A communication semiconductor integrated circuit device according to claim 2, wherein the PLL circuit can select one of a plurality of levels as the initial voltage and the second register designates one of the plurality of levels.

5. A communication semiconductor integrated circuit device according to claim 4, wherein a first current source for charging up the voltage across the filter capacitor at a start-up time and a second current source for charging up the voltage across the filter capacitor are provided, the second current source flows a current larger than a current flowing from the first current source, a time during which the second current source charges up the voltage across the filter capacitor is changed with a setting value in the second register.

6. A communication semiconductor integrated circuit device according to claim 1, wherein the signal having the predetermined frequency is a modulated signal obtained by modulating a signal having a first frequency by transmission data, and the feedback signal is a signal which is output from a mixer for synthesizing an oscillation signal of the oscillator circuit and a signal having a second frequency higher than the first frequency and which has a frequency equal to a difference between a frequency of the oscillation signal and the frequency of the signal having the second frequency.

* * * * *